US009997496B2

(12) United States Patent
Tanaka et al.

(10) Patent No.: US 9,997,496 B2
(45) Date of Patent: Jun. 12, 2018

(54) SEMICONDUCTOR INTEGRATED CIRCUIT

(71) Applicant: KABUSHIKI KAISHA TOSHIBA, Tokyo (JP)

(72) Inventors: Chika Tanaka, Kanagawa (JP); Keiji Ikeda, Kanagawa (JP); Masumi Saitoh, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days. days.

(21) Appl. No.: 15/082,546

(22) Filed: Mar. 28, 2016

(65) Prior Publication Data
US 2016/0293583 A1    Oct. 6, 2016

(30) Foreign Application Priority Data

Apr. 1, 2015    (JP) ................................ 2015-075184

(51) Int. Cl.
| H01L 27/06 | (2006.01) |
| H01L 25/065 | (2006.01) |
| H01L 29/78 | (2006.01) |
| H01L 27/092 | (2006.01) |
| H01L 27/12 | (2006.01) |

(52) U.S. Cl.
CPC ...... *H01L 25/0657* (2013.01); *H01L 27/0688* (2013.01); *H01L 27/092* (2013.01); *H01L 27/1203* (2013.01); *H01L 29/7855* (2013.01)

(58) Field of Classification Search
CPC ............. H01L 21/8238; H01L 27/0922; H01L 27/0928; H01L 27/10
See application file for complete search history.

(56) References Cited

U.S. PATENT DOCUMENTS

| 4,768,076 A | * | 8/1988 | Aoki | ................... H01L 21/8221 257/351 |
| 6,166,580 A | * | 12/2000 | Sessions | ............. H01L 27/0922 257/E27.064 |
| 7,563,665 B2 | | 7/2009 | Kato | |

(Continued)

FOREIGN PATENT DOCUMENTS

| JP | 2005-354023 | 12/2005 |
| JP | 2008-243993 | 10/2008 |

(Continued)

OTHER PUBLICATIONS

Jung, S-M., et al., "The Revolutionary and Truly 3-Dimensional 25F² SRAM Technology with the smallest S³ (Stacked Single-crystal Si) Cell, 0.16um², and SSTFT (Stacked Single-crystal Thin Film Transistor) for Ultra High Density SRAM", 2004 Symposium on VLSI Technology Digest of Technical Papers, pp. 228-229 (2004).

(Continued)

*Primary Examiner* — Julia Slutsker
(74) *Attorney, Agent, or Firm* — Finnegan, Henderson, Farabow, Garrett & Dunner, L.L.P.

(57) ABSTRACT

A semiconductor integrated circuit according to an embodiment includes: a CMOS inverter including an n-channel transistor and a p-channel transistor, one of the n-channel transistor and the p-channel transistor being disposed above the other of the n-channel transistor and the p-channel transistor.

10 Claims, 9 Drawing Sheets

(56) References Cited

U.S. PATENT DOCUMENTS

| | | |
|---|---|---|
| 7,949,984 B2 | 5/2011 | Tanamoto et al. |
| 8,216,902 B2 | 7/2012 | Chang et al. |
| 2004/0144979 A1* | 7/2004 | Bhattacharyya ........ H01L 21/84 257/67 |
| 2006/0151833 A1* | 7/2006 | Yang ................ H01L 21/76283 257/347 |
| 2010/0035393 A1* | 2/2010 | Aitken ................ H01L 21/2007 438/218 |
| 2015/0372009 A1* | 12/2015 | Yamazaki ........... H01L 27/1203 257/43 |

FOREIGN PATENT DOCUMENTS

| | | |
|---|---|---|
| JP | 4398989 | 1/2010 |
| JP | 2013-232471 | 11/2013 |
| JP | 2014-222740 | 11/2014 |

OTHER PUBLICATIONS

Deng, J., et al., "Extending Technology Roadmap by Selective Device Footprint Sealing and Parasitics Engineering", VLSI-TSA, 2 pages (2008).

\* cited by examiner

| NO. | HEIGHT OF EACH LEVEL [nm] | NUMBER OF LEVELS | LEVELS OF ACTIVE REGIONS | LEVEL OF GND WIRING LINE | LEVEL OF $V_{DD}$ WIRING LINE |
|---|---|---|---|---|---|
| 1 | 247 | 2F | 1F, 2F | 1F | 2F |
| 2 |  |  |  |  | 3F |
| 3 |  | 3F | 1F, 3F |  | 2F |
| 4 |  |  |  |  | 3F |
| 5 |  | 4F | 1F, 4F | 2F | 2F |
| 6 |  |  |  |  | 3F |

SEMICONDUCTOR INTEGRATED CIRCUIT

CROSS REFERENCE TO RELATED APPLICATIONS

This application is based upon and claims the benefit of priority from prior Japanese Patent Application No. 2015-075184 filed on Apr. 1, 2015 in Japan, the entire contents of which are incorporated herein by reference.

FIELD

Embodiments described herein relate generally to semiconductor integrated circuits.

BACKGROUND

The pitch of metal wiring lines and the pitch of gates in chips have been decreasing in order to improve the gate density in the chips. Due to this, the parasitic capacitance of wires has become an important factor, besides the performance of transistors, in designing circuit layouts for improving the performance of CMOS circuits.

Element structures taking into account the parasitic capacitance around transistors have been proposed. It is known with respect to such element structures that when the pitch of gates of transistors is reduced to improve the degree of integration, the height of the gates and the height of plugs connecting to the transistors are important factors to reduce the parasitic capacitance around the gates of the transistors. This means that, in order to reduce the gate capacitance, the gate should be designed to have a low height. In conventional designs, however, wiring line layouts have not been considered. In other words, the wiring line parasitic capacitance caused in three-dimensional designs of transistors has not been considered.

A circuit layout is known, in which a circuit is divided into circuit blocks, and folded in units of the circuit blocks. This layout is intended to reduce the wiring line length, but does not take the capacitive coupling into consideration.

BRIEF DESCRIPTION OF THE DRAWINGS

FIG. 7 is a diagram showing examples of combinations of arrangements of transistors and power supply wiring lines.

DETAILED DESCRIPTION

A semiconductor integrated circuit according to an embodiment includes: a CMOS inverter including an n-channel transistor and a p-channel transistor, one of the n-channel transistor and the p-channel transistor being disposed above the other of the n-channel transistor and the p-channel transistor.

Embodiment

Figure 1:
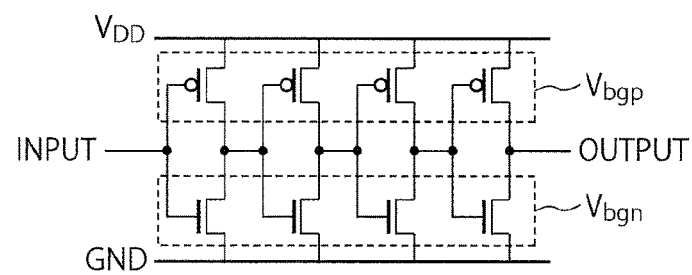
FIG. 1 is a circuit diagram illustrating an inverter chain included in a semiconductor integrated circuit according to an embodiment.
Figure 2:
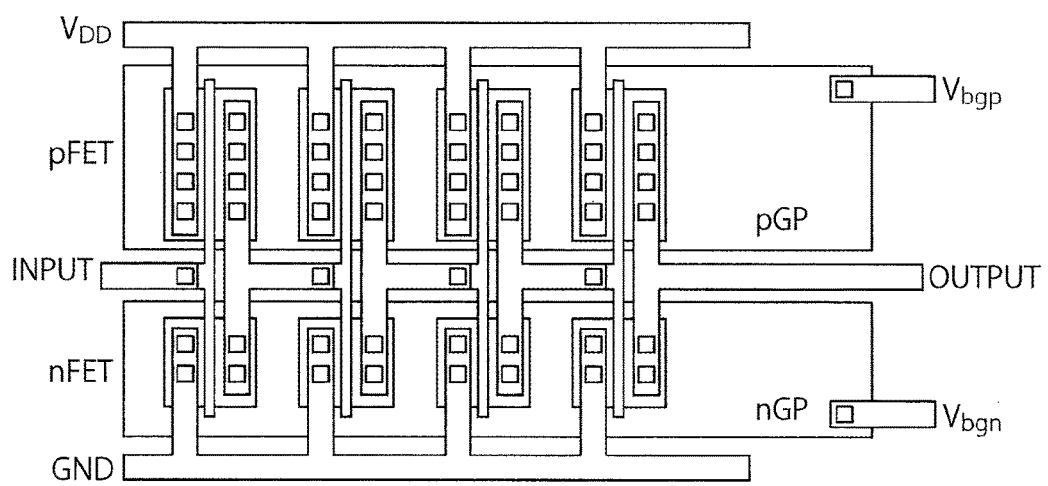
FIG. 2 is a diagram illustrating a layout of the inverter chain shown in FIG. 1.

A semiconductor integrated circuit according to an embodiment will be described with reference to FIGS. 1 to 6. The semiconductor integrated circuit according to the embodiment includes an inverter chain. The inverter chain includes, for example, four cascade-connected CMOS inverters as shown in FIG. 1. The source of the pMOSFET ("pFET") of each CMOS inverter is connected to a driving power supply $V_{DD}$, and the source of the nMOSFET ("nFET") is connected to a ground power supply GND. An input signal Input is inputted to the gates of the pFET and the nFET of the first CMOS inverter, and an output signal Output is outputted from the drains of the pFET and the nFET of the fourth CMOS inverter. Generally, the nFETs and the pFETs of the inverter chain are disposed on an identical level, as shown in FIG. 2. As will be described later, a back-gate voltage Vbgp is applied to a back gate (pGP) 38 of the pFETs, and a back-gate voltage Vbgn is applied to a back gate (nGP) 18 of the nFETs.

In contrast, the nFETs of the inverter chain according to the embodiment is disposed to a first level, and the pFETs are disposed to a higher level.

nFET

Figure 3:
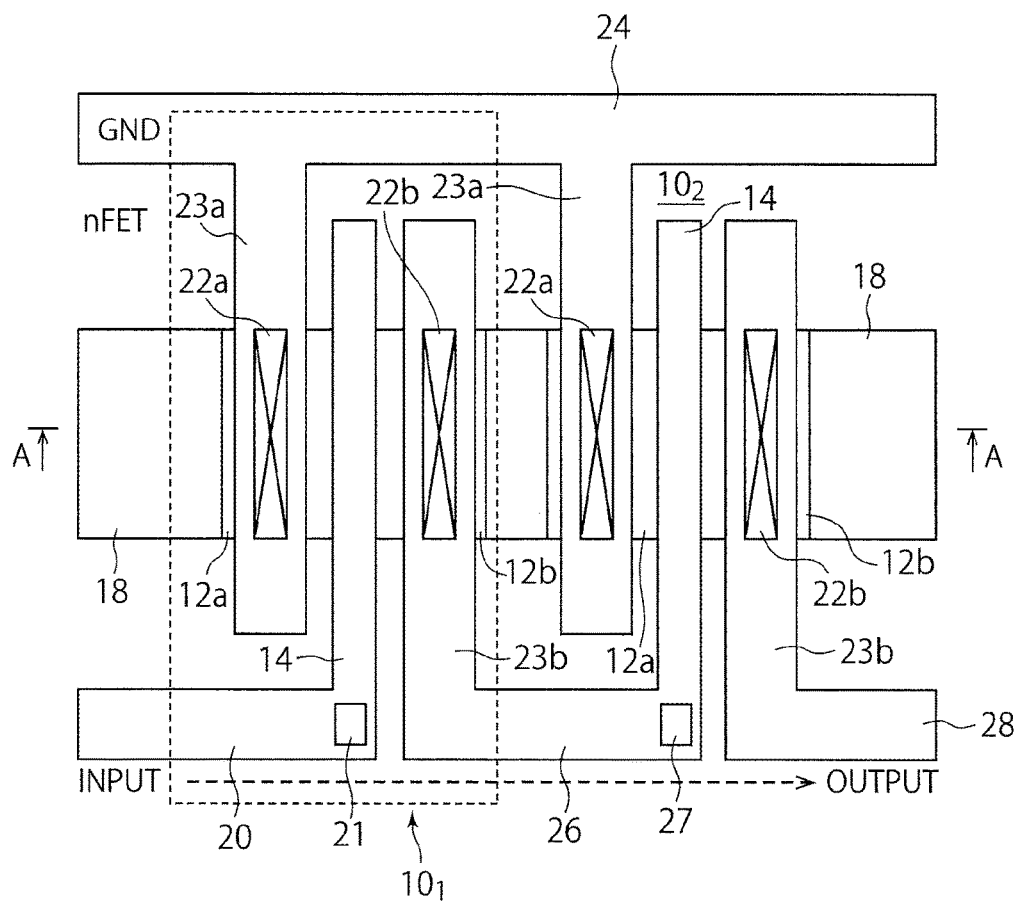
FIG. 3 is a diagram illustrating a layout of nFETs of the inverter chain included in the semiconductor integrated circuit according to the embodiment.
Figure 4:
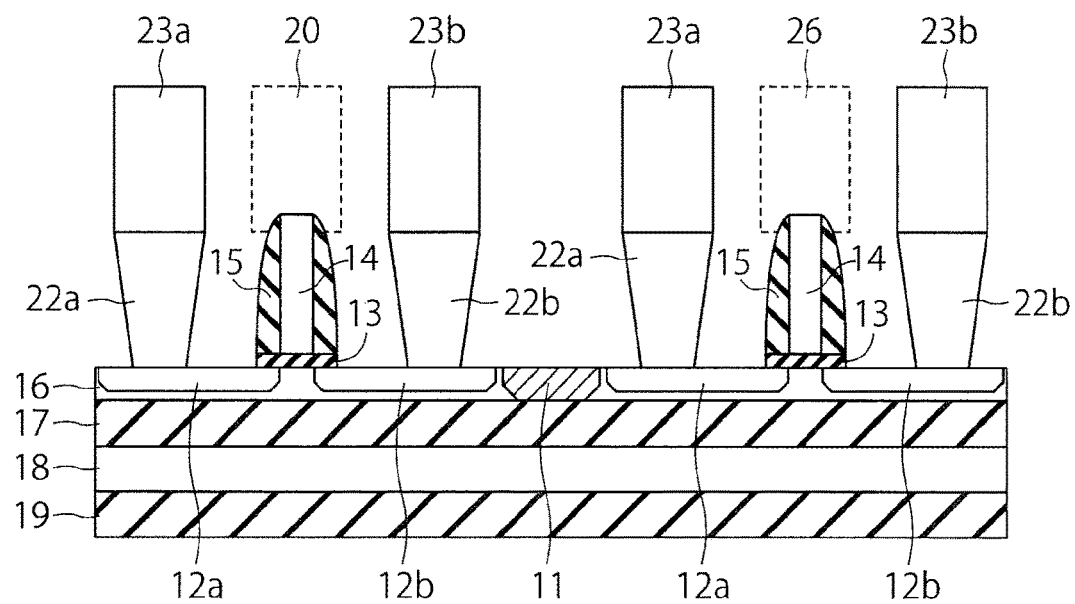
FIG. 4 is a cross-sectional view of the nFETs taken along line A-A of FIG. 3.

FIG. 3 shows a layout of nFETs $10_1$ and $10_2$ of cascade-connected two CMOS inverters according to the embodiment, and FIG. 4 shows a cross section of the layout taken along line A-A of FIG. 3. The nFETs $10_1$ and $10_2$ are disposed in a semiconductor region 16. The semiconductor region 16 is disposed on an insulating film 17 on a metal back gate 18. The back gate 18 is disposed on an insulating film 19.

Each nFET $10_i$ (i=1, 2) includes a source 12a and a drain 12b disposed in the semiconductor region 16, a gate insulating film 13 disposed on a portion of the semiconductor region 16 between the source 12a and the drain 12b, and a gate 14 disposed on the gate insulating film 13. The portion of the semiconductor region 16 serves as channel. As shown in FIG. 4, gate sidewalls 15 of an insulating material are disposed at side portions of each gate 14. An element isolation region 11 is disposed in the semiconductor region 16 between the first nFET $10_1$ and the second nFET $10_2$.

In the first nFET $10_1$, the gate 14 is connected to an input line 20, the source 12a is connected to a ground power supply wiring line (GND wiring line) 24 via a contact 22a and a source wiring line 23a, and the drain 12b is connected to a wiring line 26 via a contact 22b and a drain wiring line 23b.

In the second nFET $10_2$, the gate 14 is connected to the wiring line 26, the source 12a is connected to the ground power supply wiring line (GND wiring line) 24 via the contact 22a and the source wiring line 23a, and the drain 12b is connected to an output line 28 via the contact 22b and the drain wiring line 23b. As a result, the drain 12b of the first nFET $10_1$ is connected to the gate 14 of the nFET $10_2$ via the contact 22b, the drain wiring line 23b, and the wiring line 26. Although FIG. 3 illustrates that the back gate 18 is exposed except for the regions of the source 12a, the drain 12b, and the gate 14 of each nFET, this is an explicit illustration of the back gate 18. In the actual arrangement, the insulating film 17 and the semiconductor region 16 are disposed on the back gate 18 as shown in FIG. 4.

pFET

Figure 5:
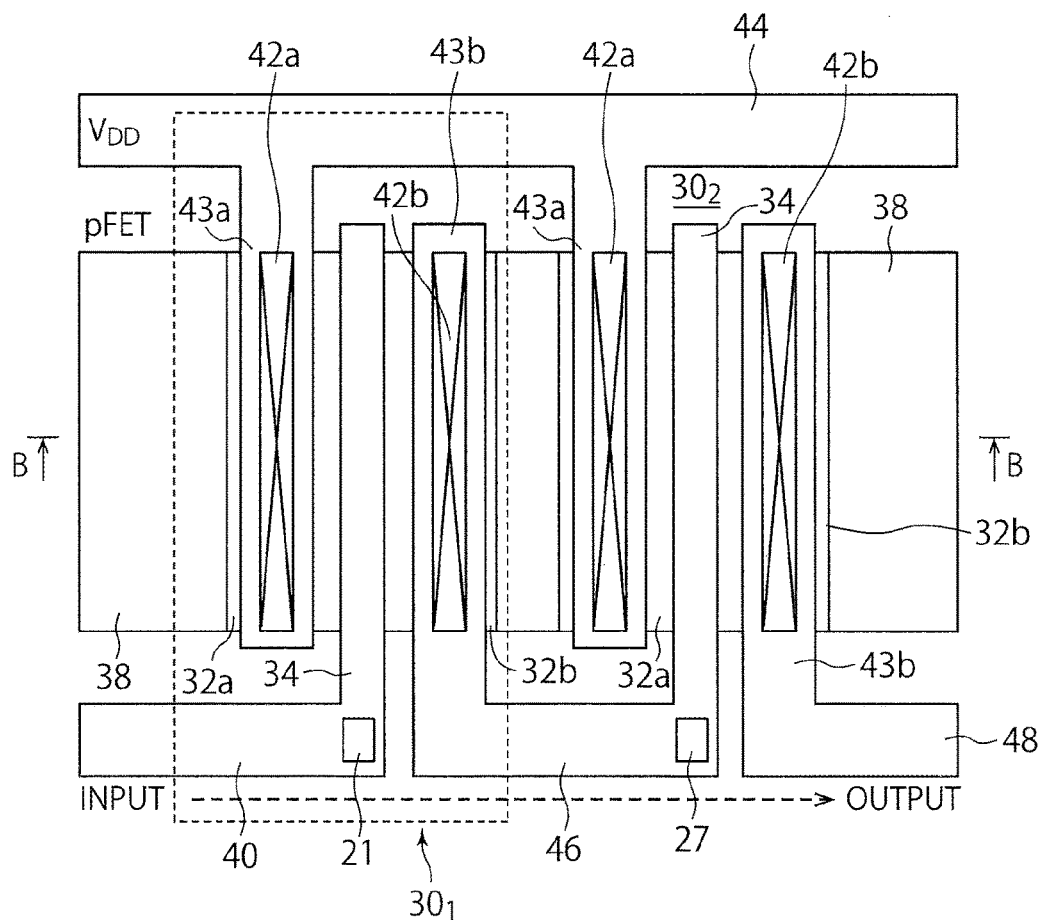
FIG. 5 is a diagram illustrating a layout of pFETs of the inverter chain included in the semiconductor integrated circuit according to the embodiment.
Figure 6:
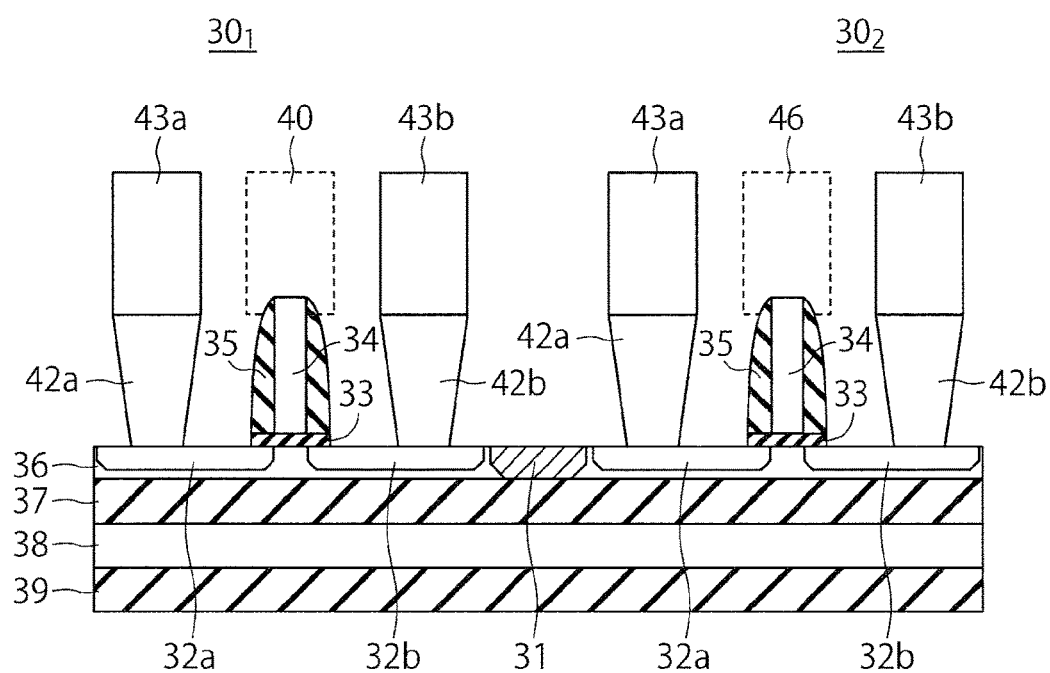
FIG. 6 is a cross-sectional view of the pFETs taken along line B-B of FIG. 5.

FIG. 5 shows a layout of pFETs $30_1$ and $30_2$ of the CMOS inverter, which are disposed on a higher level than the nFETs $10_1$ and $10_2$. FIG. 6 shows a cross section taken along line B-B of FIG. 5. The pFETs $30_1$ and $30_2$ are disposed in a semiconductor region 36. The semiconductor region 36 is disposed on an insulating film 37 on a metal back gate 38. The back gate 38 is disposed on the insulating film 39.

Each pFET $30_i$ (i=1, 2) includes a source 32a and a drain 32b disposed in the semiconductor region 36, a gate insulating film 33, which serves as a channel, disposed on a portion of the semiconductor region 36 between the source 32a and the drain 32b, and a gate 34 disposed on the gate insulating film 33. As shown in FIG. 6, gate sidewalls 35 of an insulating material are disposed at side portions of each gate 34. An element isolation region 31 is disposed in the semiconductor region 36 between the first pFET $30_1$ and the second pFET $30_2$.

In the first pFET $30_1$, the gate 34 is connected to an input line 40, the source 32a is connected to a driving power supply wiring line ($V_{DD}$ wiring line) 44 via a contact 42a and a source wiring line 43a, and the drain 32b is connected to a wiring line 46 via a contact 42b and a drain wiring line 43b.

In the second pFET $30_2$, the gate 34 is connected to the wiring line 46, the source 32a is connected to the driving power supply wiring line ($V_{DD}$ wiring line) 44 via the contact 42a and the source wiring line 43a, and the drain 32b is connected to an output line 48 via the contact 42b and the drain wiring line 43b. As a result, the drain 32b of the first pFET $30_1$ is connected to the gate 34 of the second pFET $30_2$ via the contact 42b, the drain wiring line 43b, and the wiring line 46. Although FIG. 5 illustrates that the back gate 38 is exposed except for the regions of the source 32a, the drain 32b, and the gate 34 of each pFET, this is an explicit illustration of the back gate 38. In the actual arrangement, the insulating film 37 and the semiconductor region 36 are disposed on the back gate 38.

The pFETs $30_1$ and $30_2$ are disposed immediately above the nFETs $10_1$ and $10_2$, respectively. The input line 40 is connected to the input line 20 through a via contact 21 formed through the input line 20, and the wiring line 46 is connected to the wiring line 26 through the via contact 27 formed through the wiring line 26. The output line 28 and the output line 48 are connected to each other.

In the above descriptions, the inverter chain includes two CMOS inverters. However, the inverter chain may include three or more cascade-connected CMOS inverters, or include only one CMOS inverter.

Figure 8:
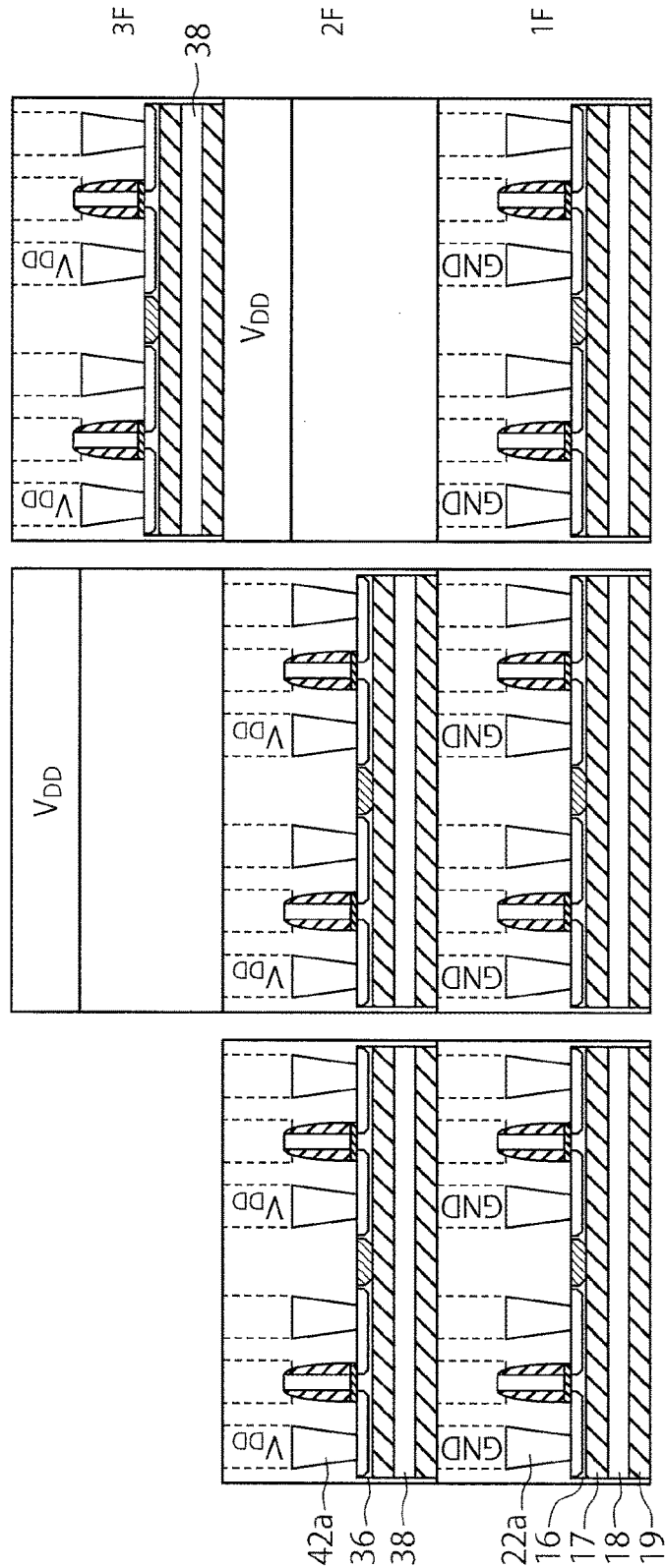
FIG. 8 illustrates cross sections of first to third combinations of the arrangements of transistors and power supply wiring lines.
Figure 9:
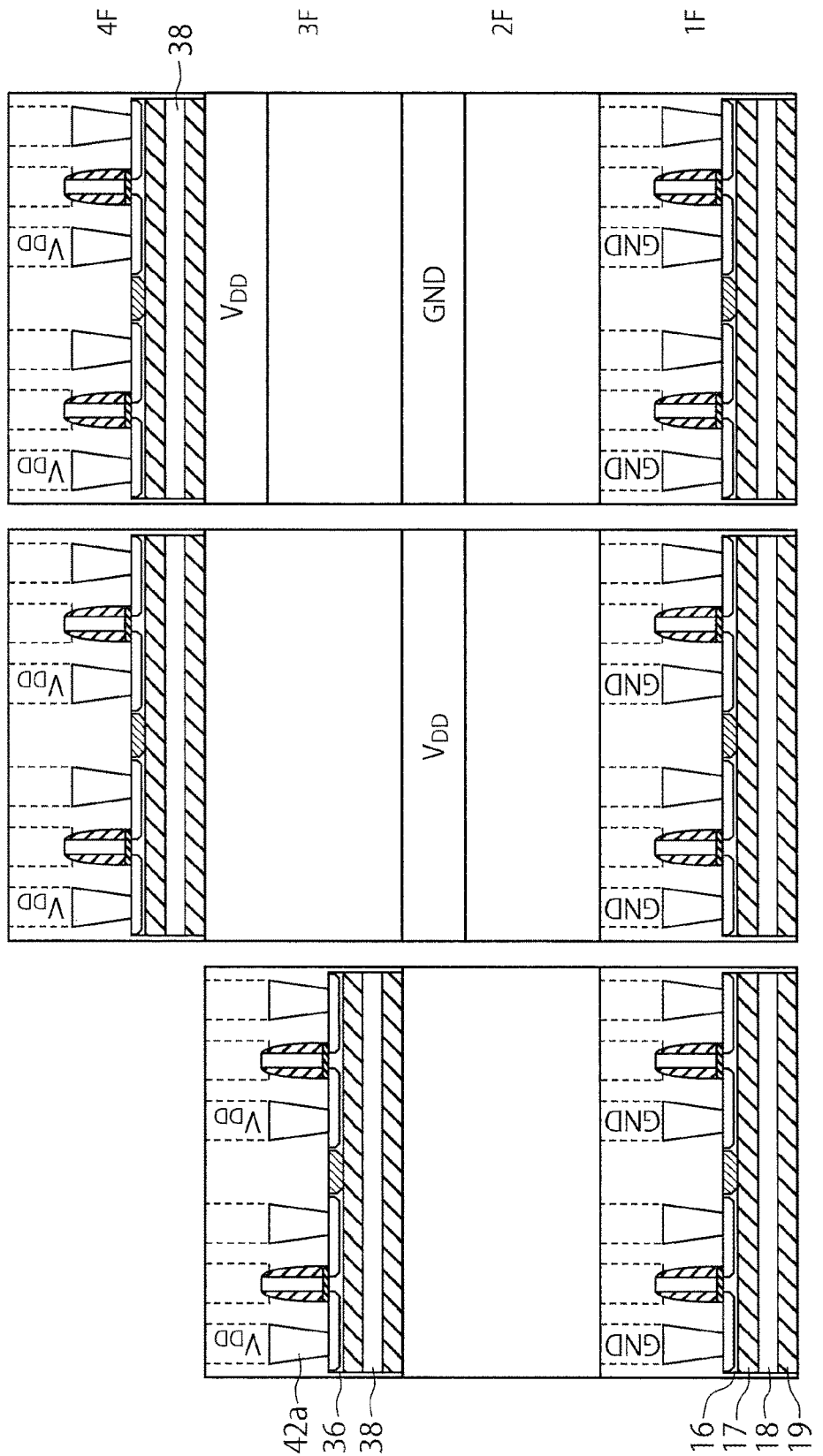
FIG. 9 illustrates cross sections of fourth to sixth combinations of the arrangements of transistors and power supply wiring lines.

As described above, in this embodiment, the nFETs of the CMOS inverter chain are disposed on the first level, and the pFETs are disposed on a level higher than the first level. Simulations are performed to obtain layouts with a low parasitic capacitance, in consideration of the arrangement of the $V_{DD}$ wiring line and the GND wiring line. FIG. 7 shows combinations of levels on which the FETs (active regions), the $V_{DD}$ wiring line, and the GND wiring line in the simulations are disposed. As can be understood from FIG. 7, there are six combinations. FIG. 8 shows cross sections of first to third combinations, and FIG. 9 shows cross sections of fourth to sixth combinations.

The first combination (No. 1) represents a case where the nFETs and the GND wiring line are disposed on the first level, and the pFETs and the $V_{DD}$ wiring line are disposed on the second level. Thus, the inverter chain includes the first level and the second level.

The second combination (No. 2) represents a case where the nFETs and the GND wiring line are disposed on the first level, the pFETs are disposed on the second level, and the $V_{DD}$ wiring line is disposed on the third level. Thus, the inverter chain includes the first level, the second level, and the third level.

The third combination (No. 3) represents a case where the nFETs and the GND wiring line are disposed on the first level, the pFETs are disposed on the third level, and the $V_{DD}$ wiring line is disposed on the second level. Thus, the inverter chain includes the first level, the second level, and the third level.

The fourth combination (No. 4) represents a case where the nFETs and the GND wiring line are disposed on the first level, and the pFETs and the $V_{DD}$ wiring line are disposed on the third level. Thus, the inverter chain includes the first level, the second level, and the third level.

The fifth combination (No. 5) represents a case where the nFETs and the GND wiring line are disposed on the first level, the pFETs are disposed on the fourth level, and the $V_{DD}$ wiring line is disposed on the second level. Thus, the inverter chain includes the first level, the second level, the third level, and the fourth level. In this case, elements other than those included in the CMOS inverter chain are disposed on the third level. For example, if the CMOS inverter chain is included in a logic circuit, peripheral circuits for driving the logic circuit are disposed on the third level.

The sixth combination (No. 6) represents a case where the nFETs are disposed on the first level, the GND wiring line is disposed on the second level, the pFETs are disposed on the fourth level, and the $V_{DD}$ wiring line is disposed on the third level. Thus, the inverter chain includes the first level, the second level, the third level, and the fourth level.

The height of each level in the simulations is 247 nm. The breakdown of the total height 247 nm of the elements shown in FIG. 4 includes 20 nm for the thickness of the insulating film 19, 30 nm for the thickness of the back gate 18, 20 nm for the thickness of the insulating film 17, 10 nm for the thickness of the semiconductor region 16, 2 nm for the thickness of the gate insulating film 13, 75 nm for the height of the gate 14, and the 90 nm for the height of the gate wiring line 20.

Figure 10:
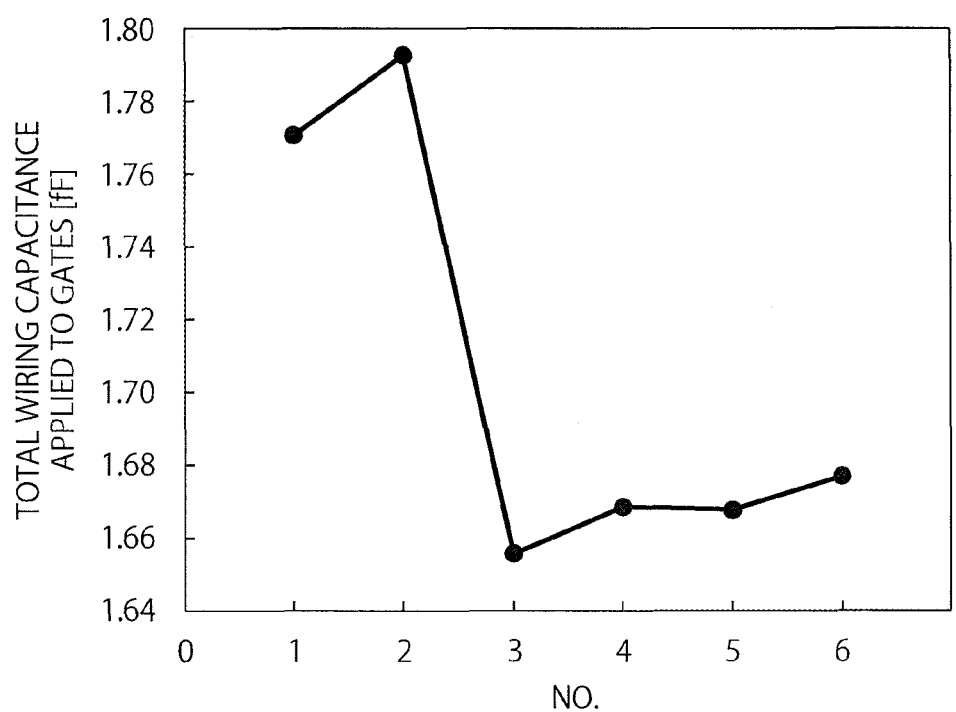
FIG. 10 is a diagram showing the relationship between the wiring line capacitance applied to the gates and the first to sixth combinations.

FIG. 10 shows the simulation results. The lateral axis indicates the numbers of the first to sixth combinations, and the longitudinal axis indicates the total capacitance of the wiring lines ($V_{DD}$ wiring line and GND wiring line) applied to the gates of the nFETs and the pFETs.

Although the first combination (No. 1) has the most compact layout, the capacitance between the gates of the nFETs and the pFETs and the wiring lines is not smaller than the capacitances of the third to the sixth combinations.

The second combination (No. 2) has the layout obtained by moving the $V_{DD}$ wiring line of the first combination to the third level. This causes the $V_{DD}$ wiring line to be disposed above the gates of the pFETs to increase the coupling between the gates and the wiring line, thereby increasing the capacitance between the gates and the wiring line.

The third combination (No. 3) has the layout in which the nFETs are disposed on the first level, and the pFETs are disposed on the third level. Thus, one level is present between the gates of the nFETs and the back gate of the pFETs. This reduces the coupling between the gates of the nFETs and the back gate of the pFETs. Furthermore, since the metal back gate of the pFETs is present between the $V_{DD}$ wiring line and the gates of the pFETs, the capacitance between the gates and the wiring line becomes low since the gates are shielded by the back gate.

In the fourth combination (No. 4), the $V_{DD}$ wiring line is disposed on the source electrodes of the pFETs. Therefore, unlike the third combination, the fourth combination does not have a shield effect obtained from the back gate, and has a greater capacitance between the gates and the $V_{DD}$ wiring line than the third combination.

In the fifth combination (No. 5), the $V_{DD}$ wiring line is disposed between the first level including the nFETs and the fourth level including the pFETs, and in the sixth combination (No. 6), the $V_{DD}$ wiring line and the GND wiring line are disposed between the first level and the fourth level. In both the cases, the coupling between the gates and the back gate does not greatly change from the coupling of the third combination. This indicates that only a single level is sufficient to be disposed between the level including the nFETs and the level including the pFETs as in the third or fourth combination in order to suppress the coupling between the gates and the back gate.

From the foregoing, preferable layouts for a CMOS inverter on a well level, for example, may be obtained by disposing the $V_{DD}$ wiring line between the level of the nFETs and the level of the pFETs so that the $V_{DD}$ wiring line is shielded by the back gate (third combination, fifth and sixth combinations), and by disposing at least one level between the level of the nFETs and the level of the pFETs to avoid the coupling between the upper layer and the lower layer.

Although the pFETs are disposed on a higher level than the level on which the nFETs are disposed in the above descriptions, the pFETs may be disposed to a level lower than the level on which the nFETs are disposed.

As described above, the wiring line capacitance with respect to three-dimensionally stacked transistors may be lowered in the semiconductor integrated circuit according to the embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit comprising:
   a CMOS inverter including an n-channel transistor and a p-channel transistor, one of the n-channel transistor and the p-channel transistor being disposed on a first level, and another of the n-channel transistor and the p-channel transistor being disposed on a second level below the first level; and
   a first wiring disposed on a third level between the first level and the second level, the first wiring being electrically connected to a source of the one of the n-channel transistor and the p-channel transistor, and being configured to supply a first voltage to the source of the one of the n-channel transistor and the p-channel transistor.

2. The circuit according to claim 1, further comprising a second wiring disposed on the second level, the second wiring being electrically connected to a source of the other of the n-channel transistor and the p-channel transistor, and being configured to supply a second voltage to the source of the other of the n-channel transistor and the p-channel transistor.

3. The circuit according to claim 1, further comprising a back gate of the one of the n-channel transistor and the p-channel transistor, the back gate being disposed between the first wiring and the one of the n-channel transistor and the p-channel transistor.

4. A semiconductor integrated circuit comprising:
   a CMOS inverter including an n-channel transistor and a p-channel transistor, one of the n-channel transistor and the p-channel transistor being disposed on a first level, and another of the n-channel transistor and the p-channel transistor being disposed on a second level below the first level;
   a first wiring disposed on a third level between the first level and the second level, the first wiring being configured to supply a first voltage to the one of the n-channel transistor and the p-channel transistor; and
   a second wiring disposed on a fourth level between the second level and the third level, the second wiring being configured to supply a second voltage to the other of the n-channel transistor and the p-channel transistor.

5. The circuit according to claim 1, wherein gates of the n-channel transistor and the p-channel transistor included in the CMOS inverter are connected to each other through a via contact.

6. A semiconductor integrated circuit comprising:
   a group of inverters including a first CMOS inverter containing an output terminal and a second CMOS inverter containing an input terminal connected to the output terminal of the first CMOS inverter, each of the first and second CMOS inverters including an n-channel transistor and a p-channel transistor, one of the n-channel transistor and the p-channel transistor in each of the first and second CMOS inverters being disposed on a first level, and another of the n-channel transistor and the p-channel transistor being disposed on a second level below the first level; and
   a first wiring disposed on a third level between the first level and the second level, the first wiring being electrically connected to a source of the one of the n-channel transistor and the p-channel transistor of each of the first and second CMOS inverters, and being configured to supply a first voltage to the source of the one of the n-channel transistor and the p-channel transistor of each of the first and second CMOS inverters.

7. The circuit according to claim 6, further comprising a second wiring disposed on the second level, the second wiring being electrically connected to a source of the other of the n-channel transistor and the p-channel transistor of each of the first and second CMOS inverters, and being configured to supply a second voltage to the source of the other of the n-channel transistor and the p-channel transistor of each of the first and second CMOS inverters.

8. The circuit according to claim 6, further comprising a back gate of the one of the n-channel transistor and the p-channel transistor of each of the first and second CMOS inverters, the back gate being disposed between the first wiring and the one of the n-channel transistor and the p-channel transistor of each of the first and second CMOS inverters.

9. The circuit according to claim 6, further comprising a second wiring disposed on a fourth level between the second level and the third level in each of the first and second CMOS inverters, the second wiring being configured to supply a second voltage to the other of the n-channel transistor and the p-channel transistor of each of the first and second CMOS inverters.

10. The circuit according to claim 6, wherein gates of the n-channel transistor and the p-channel transistor in each of the first and second CMOS inverters are connected to each other through a via contact.

\* \* \* \* \*